(12) United States Patent
Kramer et al.

(10) Patent No.: US 7,850,013 B1
(45) Date of Patent: Dec. 14, 2010

(54) LOCKING MECHANISM FOR RACK MOUNTED DEVICES

(75) Inventors: David B. Kramer, San Jose, CA (US); Peter Williams, Pittsboro, NC (US)

(73) Assignee: Cisco Technology, Inc., San Jose, CA (US)

( * ) Notice: Subject to any disclaimer, the term of this patent is extended or adjusted under 35 U.S.C. 154(b) by 330 days.

(21) Appl. No.: 11/821,007

(22) Filed: Jun. 21, 2007

(51) Int. Cl.
*E05B 73/00* (2006.01)

(52) U.S. Cl. .............................. 211/4; 211/26; 312/216; 70/78; 70/94; 70/DIG. 64; 248/551

(58) Field of Classification Search ............... 211/4, 211/8, 26, 175, 207, 190, 204, 206, 189, 211/191, 192; 312/261, 223.1, 265.1–265.4; 70/14, 18, 58, 78, 94, 101, 64, 65, 66, 159–162, 70/402, DIG. 64, DIG. 65, DIG. 66; 248/551; 292/259 R; 361/724–727
See application file for complete search history.

(56) References Cited

U.S. PATENT DOCUMENTS

| 800,648 | A | * | 10/1905 | Hinginbotham | 70/310 |
|---|---|---|---|---|---|
| 1,421,726 | A | * | 7/1922 | William | 70/261 |
| 1,882,339 | A | * | 10/1932 | Richards | 70/121 |
| 2,677,261 | A | * | 5/1954 | Jacobi | 70/14 |
| 2,837,905 | A | * | 6/1958 | Wroughton | 70/90 |
| 3,273,935 | A | * | 9/1966 | Carson | 296/76 |
| 3,516,719 | A | * | 6/1970 | Weisblat | 312/216 |
| 3,592,497 | A | * | 7/1971 | Logan, Jr. | 292/259 R |
| 4,003,227 | A | * | 1/1977 | Casey | 70/14 |
| 4,135,375 | A | * | 1/1979 | Voegeli | 70/77 |
| 4,696,449 | A | * | 9/1987 | Woo et al. | 248/553 |
| 4,762,350 | A | * | 8/1988 | Hurtado | 292/259 R |
| 5,103,659 | A | * | 4/1992 | Benefield, Sr. | 70/94 |
| 5,257,581 | A | * | 11/1993 | Welling | 109/24 |
| 5,267,688 | A | * | 12/1993 | Benefield | 232/17 |
| 5,447,046 | A | * | 9/1995 | Duffus | 70/101 |
| 5,493,879 | A | * | 2/1996 | Bison | 70/62 |
| 5,797,487 | A | * | 8/1998 | Young | 206/308.2 |
| 5,819,561 | A | * | 10/1998 | Blehi, III | 70/14 |
| 5,915,802 | A | * | 6/1999 | Siler | 312/216 |
| 6,212,921 | B1 | * | 4/2001 | Knighton | 70/58 |
| 6,257,542 | B1 | * | 7/2001 | Westfield et al. | 248/551 |
| 6,397,644 | B1 | * | 6/2002 | Gidding | 70/18 |
| 6,591,765 | B2 | * | 7/2003 | Braddock | 109/52 |
| 6,695,149 | B1 | * | 2/2004 | Cote et al. | 211/26 |

(Continued)

*Primary Examiner*—Darnell M Jayne
*Assistant Examiner*—Devin Barnett
(74) *Attorney, Agent, or Firm*—BainwoodHuang

(57) ABSTRACT

A locking mechanism to minimize access to a portion of a rack-mounted electronic device is provided. The locking mechanism includes a bar supported at one end to a first vertical post of the rack, and a locking member supported at a second end of the bar for locking to a second vertical post. In one embodiment, the bar is pivotally supported at the one end to the first post. The bar is movable between an open position where unimpeded access to a first portion of the electronic device is provided, and a closed position to restrict removal of components from the first portion of the electronic device. A clearance space may provided between the bar and the electronic device in the closed position to allow a user to access an electronic component to remove power from the component, but not to fully remove the component without unlocking the locking member.

19 Claims, 9 Drawing Sheets

U.S. PATENT DOCUMENTS

| | | | |
|---|---|---|---|
| 6,741,463 B1 * | 5/2004 | Akhtar et al. | 361/679.41 |
| 6,758,353 B2 * | 7/2004 | Orr | 211/183 |
| 6,805,248 B2 * | 10/2004 | Champion et al. | 211/26 |
| 6,883,295 B1 * | 4/2005 | Negri et al. | 53/459 |
| 6,909,611 B2 * | 6/2005 | Smith et al. | 361/727 |
| 6,925,843 B1 * | 8/2005 | Pols et al. | 70/86 |
| 6,929,162 B1 | 8/2005 | Jordan | |
| 6,955,515 B2 | 10/2005 | Barina et al. | |
| 7,012,808 B2 | 3/2006 | Mayer | |
| 7,024,566 B2 * | 4/2006 | Shiwaku et al. | 713/300 |
| 7,104,094 B2 * | 9/2006 | Zadak et al. | 70/58 |
| 7,121,412 B2 * | 10/2006 | Richards et al. | 211/26 |
| 7,152,936 B2 | 12/2006 | Tarasewicz | |
| 7,156,475 B2 * | 1/2007 | Gloger, Jr. | 312/216 |
| 7,232,193 B2 | 6/2007 | Cunningham et al. | |
| 7,379,294 B2 * | 5/2008 | Chen | 361/679.33 |
| 7,473,846 B2 * | 1/2009 | Doerr et al. | 174/69 |
| 7,476,804 B2 * | 1/2009 | Adducci et al. | 174/50 |
| 7,573,726 B1 | 8/2009 | Cote et al. | |
| 2002/0030025 A1 * | 3/2002 | Sipe | 211/4 |
| 2002/0060194 A1 * | 5/2002 | Reiser et al. | 211/4 |
| 2002/0139759 A1 * | 10/2002 | Carney et al. | 211/26 |
| 2003/0026084 A1 * | 2/2003 | Lauchner | 361/826 |
| 2003/0222034 A1 * | 12/2003 | Champion et al. | 211/26 |
| 2003/0233855 A1 * | 12/2003 | Pirveysian | 70/62 |
| 2004/0074852 A1 * | 4/2004 | Knudsen et al. | 211/26 |
| 2008/0184608 A2 * | 8/2008 | Tal et al. | 42/87 |
| 2010/0079285 A1 * | 4/2010 | Fawcett et al. | 340/568.1 |

* cited by examiner

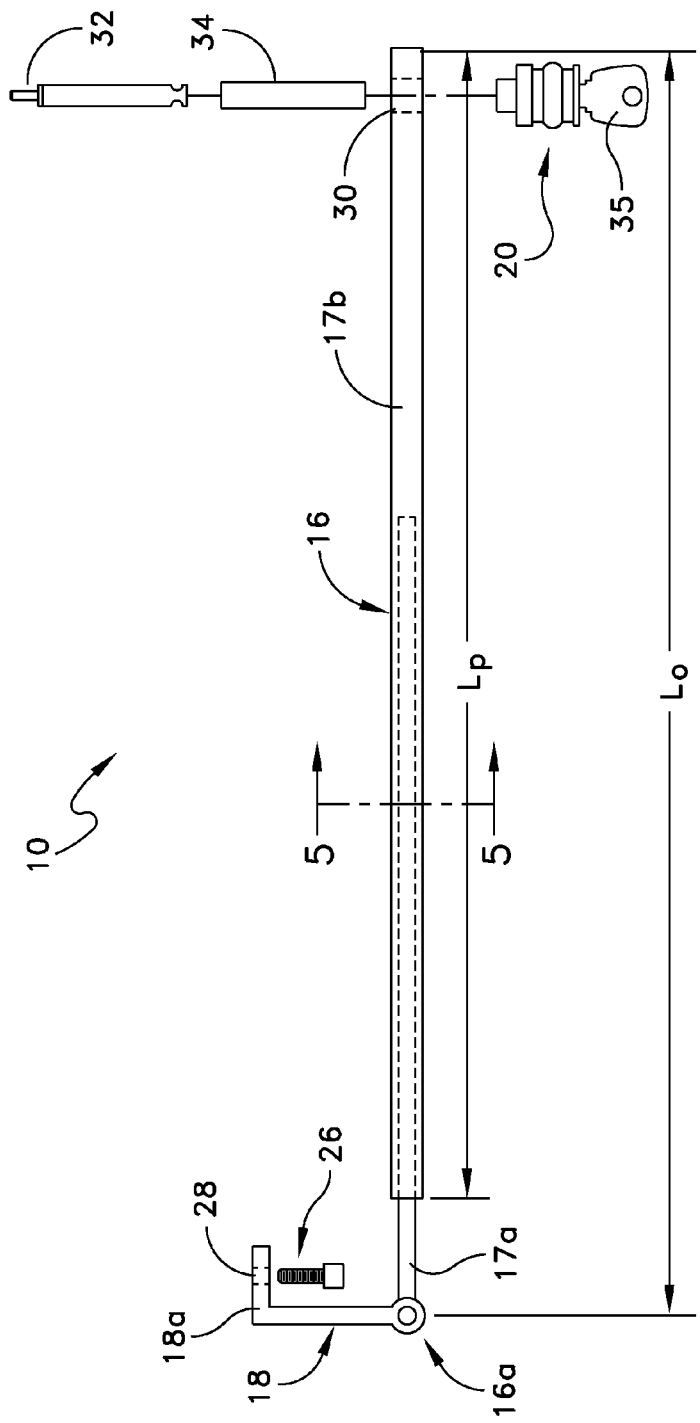
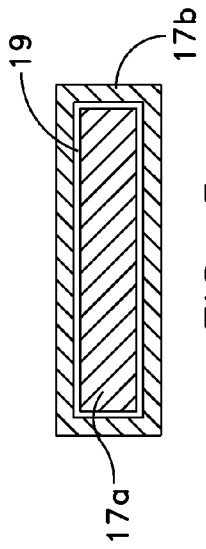
FIG. 4
FIG. 5

LOCKING MECHANISM FOR RACK MOUNTED DEVICES

BACKGROUND

Electronic devices are often mounted in a frame, or vertical rack structure, especially in office or commercial settings. This technique is referred to as "rack mounting." Most rack structures include four vertical rails or strips that have vertically aligned holes for securing horizontal rail assemblies. The secured horizontal rail assemblies create slots or drawers into which the electronic devices are received. The holes are spaced a predetermined distance apart with adjacent vertical strips having matching holes, so that each hole is part of a horizontal pair.

Over the years, the computer industry has developed a wide variety of rack mounting systems, which may vary from one industry or application to another. Most computer racks are between 24 and 42 "rack units" in height, with each rack unit being about 1.75 inches high. A standard rack is 19 inches wide, however, wider racks, for example 23 inch wide racks, are also available. Rack systems generally support a plurality of electronic devices, such as Web-servers, security systems, applications servers, fans, power modules, data servers, telecommunication equipment, and other desired servers and network components. When devices are rack mounted it is often desirable to provide access to components without having to remove the electronic devices from the rack. For example, if a component or card is failing, it may be desirable to remove power from the car to limit damage. In addition, hot swapping is a desirable feature in rack mounted devices in order to limit down time. Hot swapping is the insertion or removal of a circuit board, line card or other components of the electronic devices without powering down the whole system.

BRIEF DESCRIPTION OF THE DRAWINGS

The foregoing and other objects, features and advantages will be apparent from the following description of particular embodiments, as illustrated in the accompanying drawings in which like reference characters refer to the same parts throughout the different views. The drawings are not necessarily to scale, emphasis instead being placed upon illustrating the principles disclosed herein.

FIG. 4 is a side plan view of the example extendable locking mechanism of FIG. 3 with locking member and fastener in an exploded view;

FIG. 5 is a cross-sectional view taken along lines 5-5 of FIG. 4;

DETAILED DESCRIPTION

Overview

Figure 1:
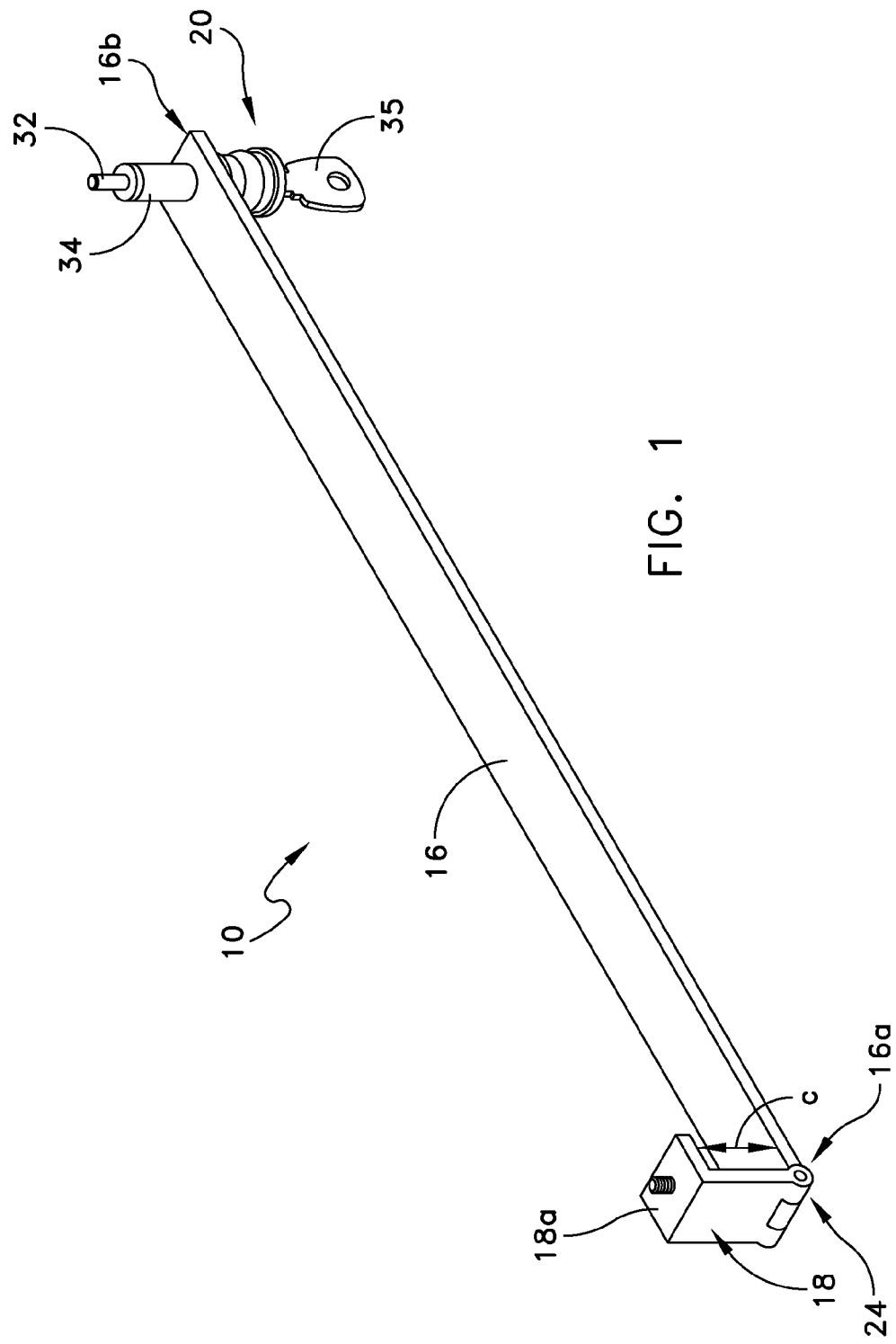
FIG. 1 is a perspective view of first embodiment of an example locking mechanism for use with a rack mounted electronic devices according to the present disclosure.

A locking mechanism for limiting access to a rack mounted electronic device, includes a locking bar having a first end, a second end and a length defined there between, the length of the locking bar being sized to span a space between a pair of adjacent, substantially parallel spaced posts; a support device constructed and arranged to support the first end of the locking bar to one of the support posts, and a locking member movable between a locked and unlocked position, the locking member constructed and arranged to detachably secure the second end of the locking bar to the other of the support posts, the bar being movable between a first, open position and a second, closed position. In the first, open position the locking bar is secured at its first end to one of the support posts by the support device and is unsecured at its second end by the locking member being disengaged from the other of the support posts, such that a user can access an electronic device supported within the rack in order to remove components of the electronic device in the open position, and in a second, closed position, the locking bar is secured at its first end to one of the support posts by the support device and is locked at its second end to the other of the support posts by the locking member which is in a locked position, at least a portion of the electronic device being obstructed and access to components of the electronic device being restricted to users who have access to unlock the locking member.

Also disclosed is a lockable rack assembly for storing electronic devices including a rack having at least a pair of adjacent, substantially parallel spaced support posts, each of the posts including one or more holes disposed there through, the posts being spaced so as to receive and support one or more electronic devices there between; a locking bar having a first end, a second end and a length defined there between, the length of the locking bar being sized to span the space between the pair of adjacent, parallel spaced posts; a support device constructed and arranged to secure the first end of the locking bar to one of the support posts; and a locking member movable between a locked and unlocked position, the locking member constructed and arranged to detachably secure the second end of the locking bar to the other of the support posts such that the bar is movable between a first, open position and a second, closed position. In the first, open position the locking bar is secured at its first end to one of the support posts by the support device and is unsecured at its second end by the locking member being disengaged from the other of the support posts, such that a user can access an electronic device supported within the rack in order to remove components of the electronic device in the open position, and in a second, closed position, the locking bar is secured at its first end to one of the support posts by the support device and is locked at its second end to the other of the support posts by the locking member which is in a locked position, at least a portion of the electronic device being obstructed by the bar and access to components of the electronic device being restricted to users who have access to unlock the locking member.

A method of providing restricted access to an electronic device mounted to a rack, the rack including at least a pair of adjacent, substantially parallel spaced support posts having one or more holes disposed there through, is disclosed including the steps of providing a bar having a first end, a second end and a length defined there between, the length of the locking bar being sized to span a space between the pair of adjacent, parallel spaced posts; securing a first end of the bar to one of the posts; positioning the bar over a portion of the electronic device such that the second end of the bar is adjacent the other of the posts; providing a locking member movable between a locked and unlocked position; locking the second end of the bar to the other of the posts with the locking member, such that the portion of the electronic device is obstructed and access to components of the electronic device is restricted to users who have access to unlock the locking member; unlocking the locking member; moving the second end of the bar in a direction away from the other of the posts and into an open position; and accessing the electronic device supported within the rack.

The locking mechanism described herein limits access to rack mounted electronic devices, does not improperly interfere with ventilation, and allows for visual inspection of the components when in a locked position. The locking mechanism may be utilized with a variety of electronic components, can readily be installed, and is intended to be unlocked only by authorized personnel. The features of the locking mechanism as described herein, may be employed in electronic equipment and methods such as those of Cisco Systems of San Jose, Calif.

Description of Example Embodiments

The embodiments disclosed herein relate to a locking mechanism for use with rack mounted electronic devices. As used herein, the terms "rack" and "rack mounted" are used in the conventional manner to mean a frame or cabinet in which electronic hardware is supported. Although the present application will make reference to a conventional rack for mounting computer hardware typically having four vertical posts or strips, with a 19" width between adjacent front and rear posts, and hole patterns in the posts repeating every 1.75 inches, the locking mechanism is explicitly not limited to such a rack. As also used herein, the term "electronic devices" refers to any electronic devices, modules, components, hardware, and/or equipment, that can be rack mounted, including but not limited to server computers, mass storage devices, telecommunications equipment, and security systems.

Figure 2:
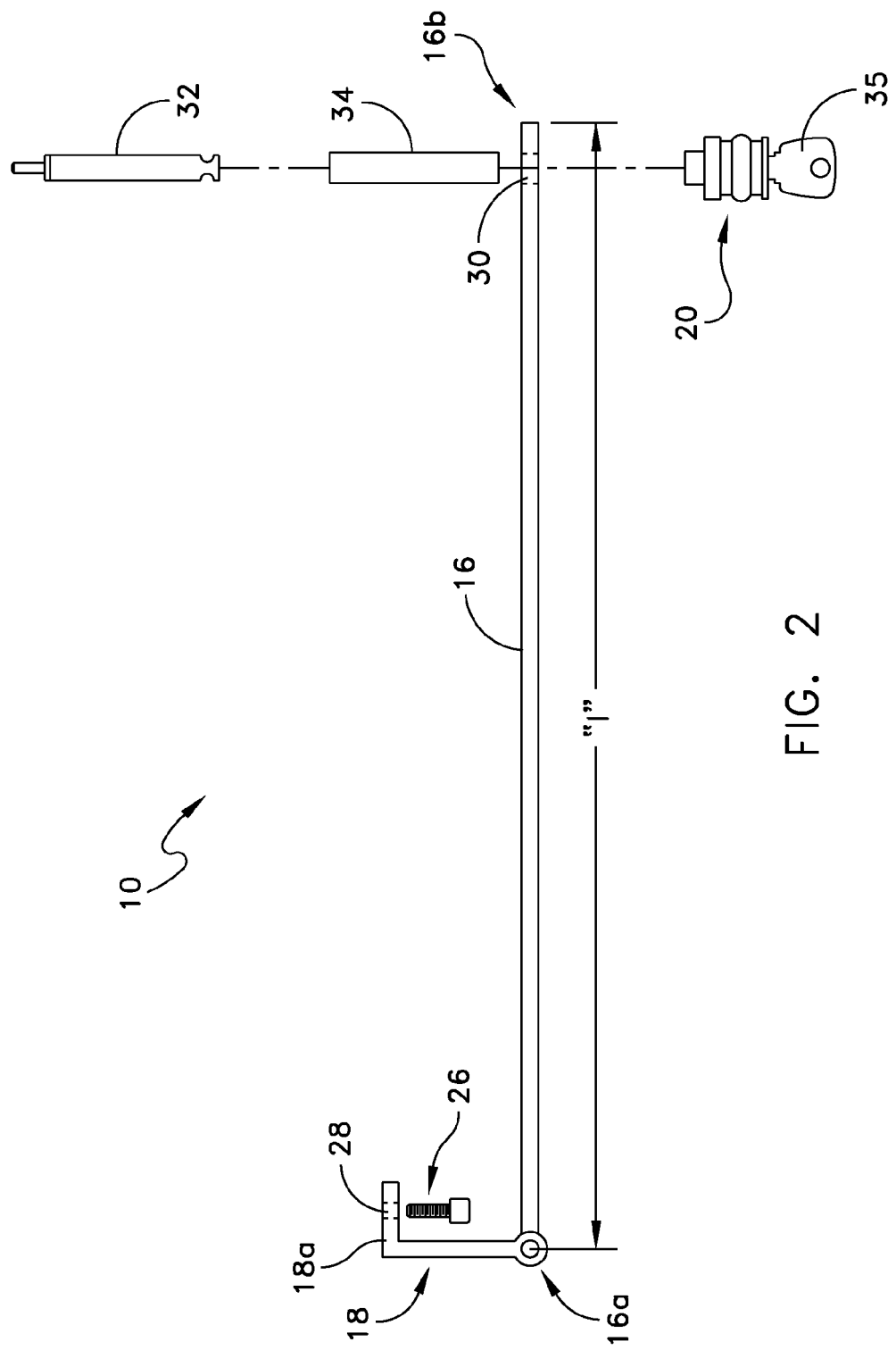
FIG. 2 is a side plan view of the example locking mechanism of FIG. 1 with locking member and fastener in an exploded view.
Figure 9:
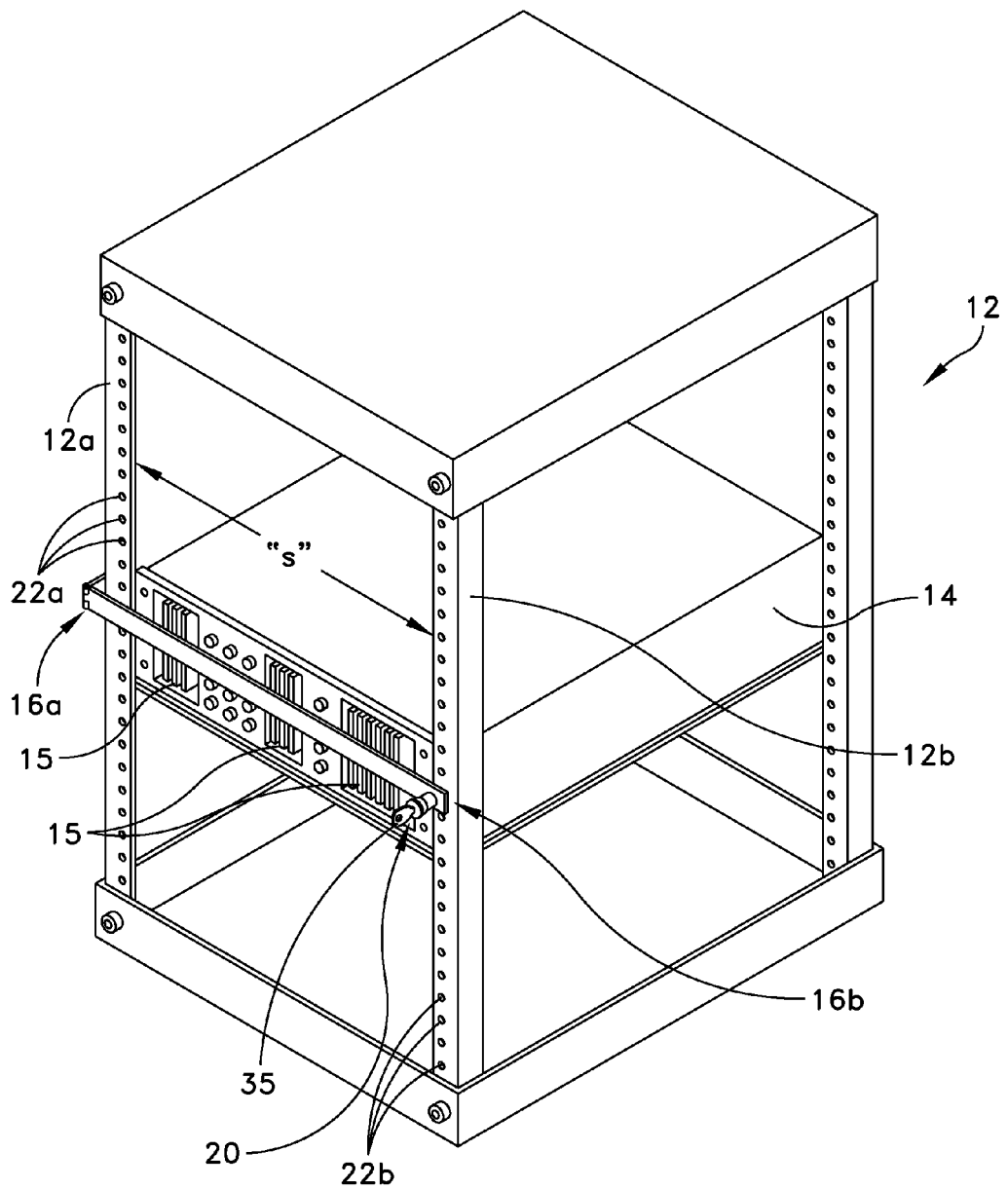
FIG. 9 is a perspective view of the example locking mechanism of FIG. 1 in use on a rack mount in a closed or locked position.

Referring initially to FIGS. 1, 2 and 9, an example locking mechanism 10 for use with a conventional rack assembly 12, to minimize unauthorized access to electronic devices 14 mounted within the rack is illustrated. The example locking mechanism 10 includes an elongated bar 16, having a first end 16a pivotally connected to a support device 18 which is designed to secure the locking mechanism to the rack assembly, as described in further detail below. The second end 16b of the elongate bar 16 supports a locking member 20 which is configured to lock the bar to the rack assembly, so that the bar 16 is secured over the electronic device and is removable by an authorized user, as also described in further detail below.

Figure 11:
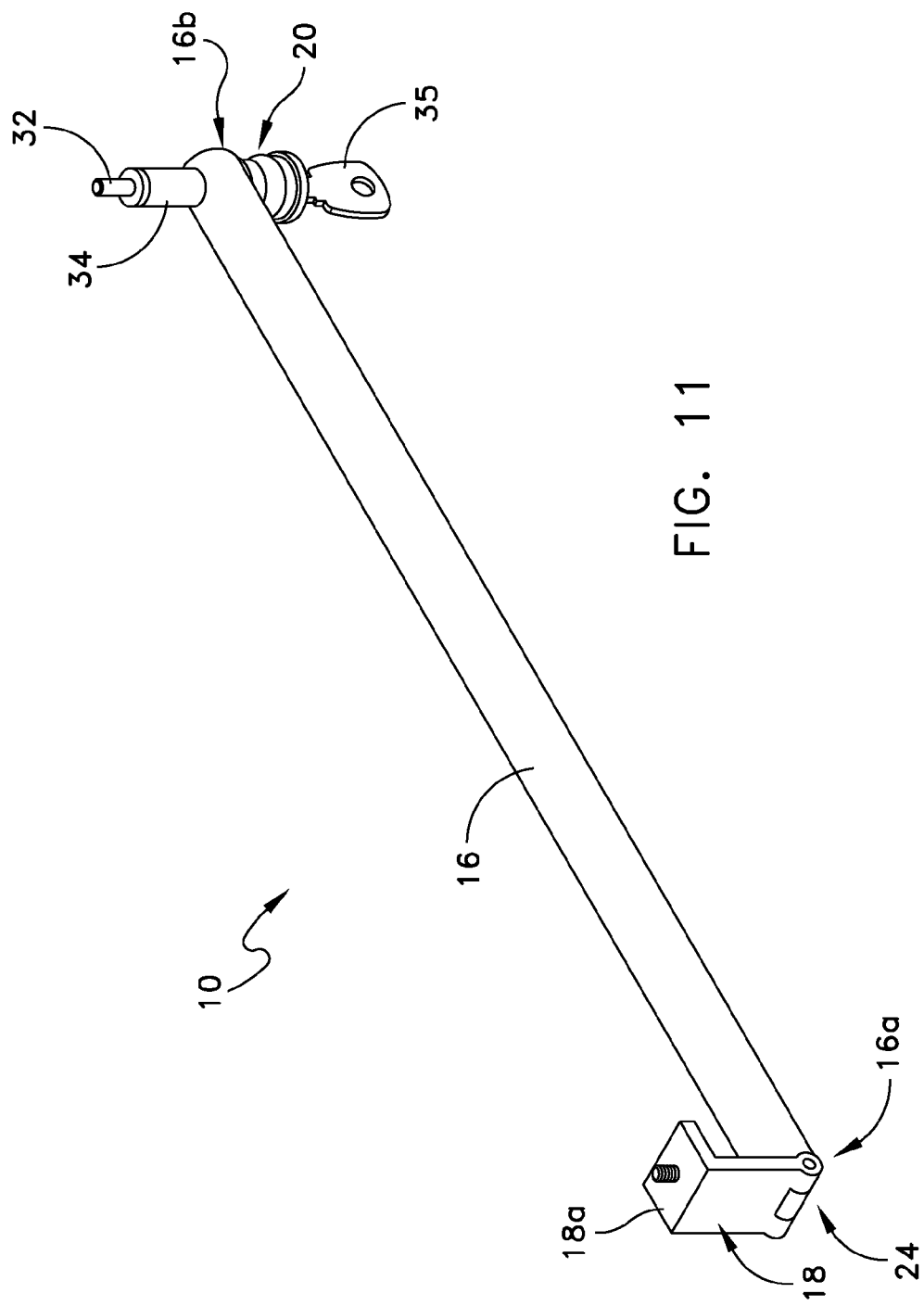
FIG. 11 is a perspective view of a fourth embodiment of an example locking mechanism for use with a rack mounted electronic devices according to the present disclosure.

Bar 16 may be generally flat with a substantially rectangular geometry, or may be cylindrical in shape as shown in FIG. 11. The length, "l" of the bar is sized to span the space "s" defined between a first post 12a and a second post 12b of the rack assembly 12 (FIG. 9). In a conventional 19-inch rack assembly, the length of the bar may be approximately 19.5 inches in order to provide sufficient length to secure the bar within the holes 22a, 22b disposed within adjacent front or adjacent back posts. The bar 16 may be made of any suitably strong, tamper resistant material, that will also be suitable for the electronic environment in which it is used. One such suitable material is aluminum, due to its strength and cost, although other materials may be utilized as would be known to those of skill in the art.

In the present embodiment, first end 16a of bar 16 is pivotally supported on support device 18, for example by hinge 24. In order to minimize the ability for unauthorized users to access the locking mechanism 10 tamper, hinge 24 may preferably have a sealed press-pin so as to prevent removal of the hinge, which could allow unauthorized removal of bar 16. Support device 18 may include mounting plate 18a that may be secured to the back of the first post 12a by a fastener 26 that is inserted within one hole 22a and then received within a suitably sized opening 28 formed in the mounting plate. The fastener may be any suitable fastener for joining two objects that is sized to fit within the holes 22a of the rack assembly 12, for example a screw, as illustrated in FIGS. 1 and 2. The fastener may have a high security head requiring a special tool for removal, and may include a lock washer for a positive locking action. The fastener is preferably inserted within the hole 22a from the side facing outward from the rack assembly, to attach to the mounting plate which is supported on the opposite side, i.e. on a side of the post facing inward. In this manner, access to the fastener is blocked when the bar is in a closed or locked position. This minimizes the ability of an unauthorized user to tamper with the fastener in order to remove the bar by circumventing the locking member 20.

Locking member 20 engages a mounting rod 32 in order to lock the bar in place. In the present embodiment, mounting rod 32 may be disposed through any of the holes 22b in the second post 12b, and is then received within opening 30 formed in the second end of the bar 16 in order to lock the bar 16 to the second post 12b. The mounting rod 32 may also include a sleeve 34 that is sized to fit over the mounting rod in order to inhibit gripping the rod for unauthorized removal. As illustrated, the locking member 20 cooperatively engages the mounting rod 32 in order to lock the second end 16b of the bar 16 to the second post 12b. The first locking member may be a conventional push lock into which the post 32 is inserted in order to lockingly engage the mounting rod and locking member, and may be unlocked by a key 35, as also illustrated. Alternatively, the locking member 20 may have any configuration as would be known to those of skill in the art, and is not limited to the device shown herein. For example, the locking member may be a push lock which can be locked by a key, as illustrated, a combination lock, or a padlock, as desired for the particular application. Once the mounting plate 18a is secured to the first post 12a, and the second end of the bar 16b is locked onto the second post 12b, the locking mechanism is in a closed or locked position.

As best illustrated in FIG. 9, in the closed or locked position the bar 16 spans the space "s" between the first and second posts 12a, 12b and blocks a portion of the electronic device 14. In this manner, unauthorized removal of components 15 from the electronic device can be minimized. However, in some circumstances it may be desirable to allow for partial removal of the components 15 without unlocking the bar 16 from the second post 12b, for example to disconnect power to the component. If it is desirable to provide for such removal, a clearance may be built into the locking mechanism by supporting the locking bar the desired distance from the electronic device. In the present embodiment, the distance is defined by the mounting plate 18a at one end and length of the locking pin 32 at the other end. The clearance "c" may differ with each electronic device, but should not be so great so as to allow for full removal of the components without first unlocking the bar. In the present embodiment the clearance "c" provided by a second mounting plate portion between the mounting plate 18a (i.e., a first mounting plate portion where the second mounting plate portion is substantially perpendicular to the first mounting plate portion) and the bar 16 in a closed position is approximately 2 inches, to allow for the partial removal without unlocking for most components.

Figure 10:
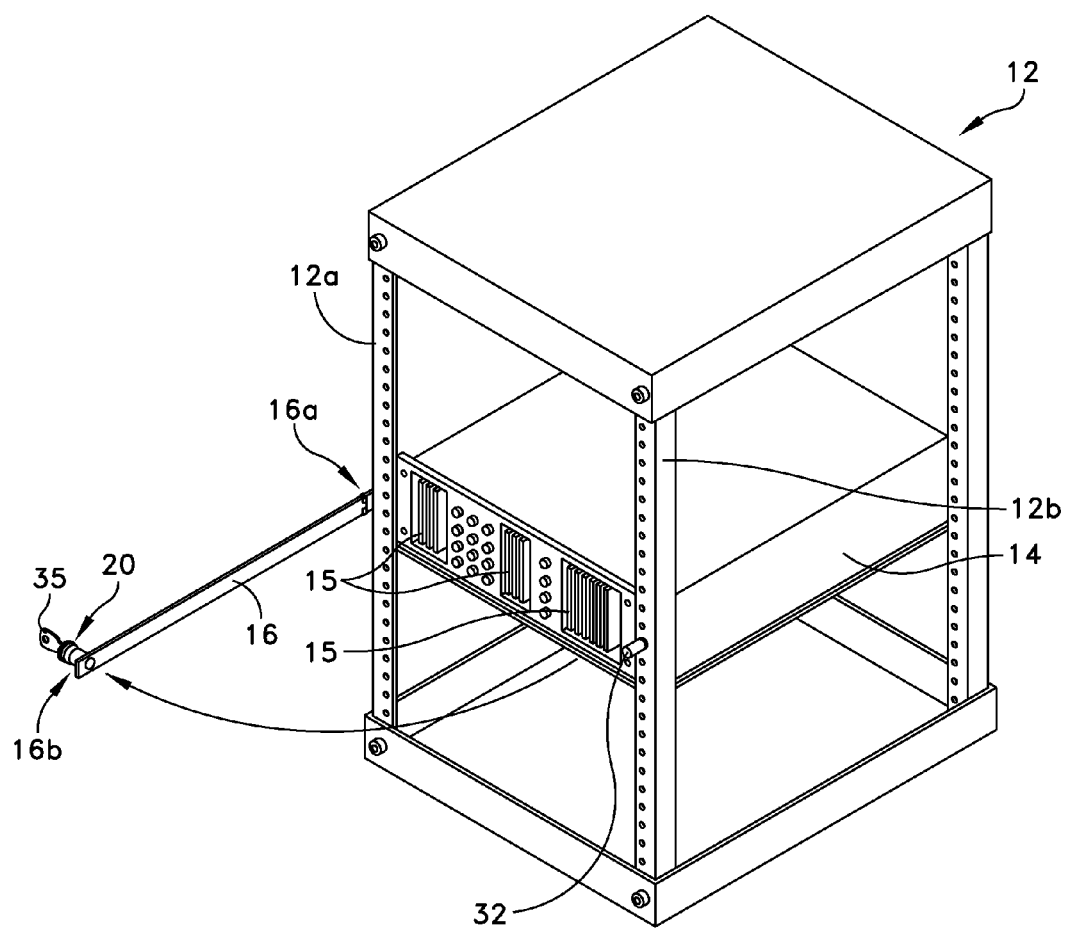
FIG. 10 is a perspective view of the example locking mechanism of FIG. 1 in use on a rack mount in an opened or unlocked position.

In use, an individual secures the locking mechanism 10 to the rack assembly 12 by inserting fastener 26 within hole 22a from the back or rear of the post 12a, and then through the suitably sized opening 28 formed in the mounting plate 18a. In this manner, the mounting plate 18a is supported on the back of the first post 12a. The bar 16 is pivotally attached its first end 16a to the mounting plate by hinge 24, and may be pivoted into the open position to facilitate securing the fastener to the post and then into the mounting plate. In this manner, access to the fastener is substantially blocked when the bar is in a closed or locked position. The bar may then be pivoted to the closed position such that the bar extends across the spacing "s" between the first and the second posts 12a, 12b so as to obstruct a portion of the electronic device. Mounting rod 32 is then inserted within hole 22b on the second post and through opening 30 disposed in the second end of the bar 16. The locking member 20 then engages the mounting rod in order to lock the bar 16 to the second post 12b. Once in the locked or closed position, access to the components is restricted and full removal of the components from the device is blocked by bar 16. In order to have full access to the electronic devices, the locking mechanism is moved into the open position. To open the locking mechanism, the locking member is unlocked, for example by key 35, and the first end of the bar is pivoted about the hinge 24 in order to swing the second end 16b of the bar outwardly, away from the rack. In the open position as illustrated in FIG. 10, the bar no longer spans the space between the posts and the portion of the electronic device is no longer obstructed, thus allowing for complete removal of any components.

Figure 3:
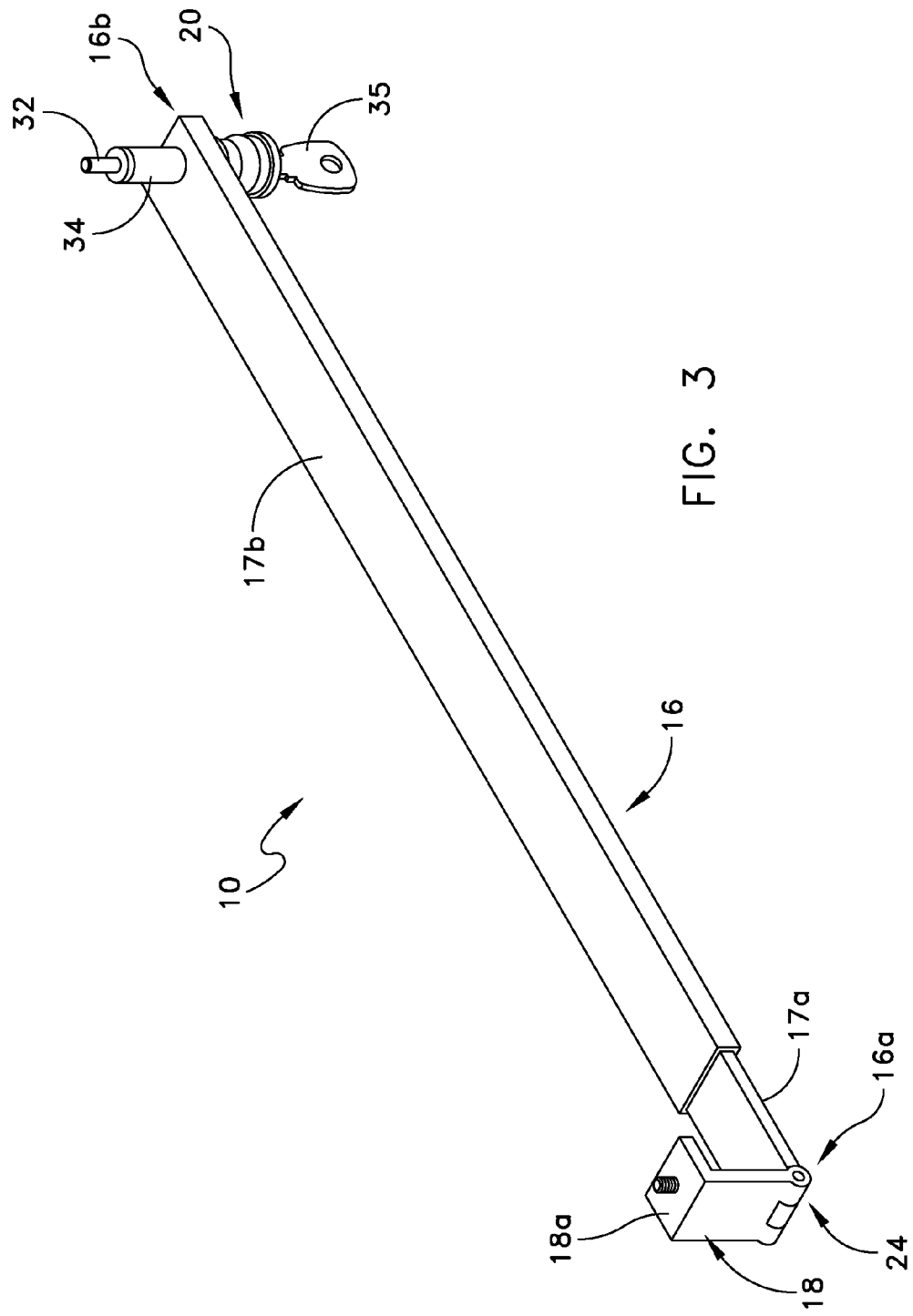
FIG. 3 is a perspective view of a second embodiment of an example extendable locking mechanism for use with a rack mounted electronic devices according to the present disclosure.

Referring now to FIGS. 3-5 a second embodiment of an example locking mechanism 10 for use with a rack assembly 12 to minimize unauthorized access to electronic devices 14 mounted within the rack is illustrated. In this embodiment, the bar 16 is adjustable in order to fit racks of varying widths, or to mount the bar diagonally between posts of the rack instead of horizontally. The exemplary adjustable bar 16 includes a first, telescoping section 17a and a second section 17b. The second section 17b includes an interior cavity 19 disposed within at least a portion of the length $L_P$ of the second section that is sized to receive the first section 17a of the bar therein. The first and section sections can slide relative to each other a predetermined amount so as to adjust the overall length of the bar, $L_O$. In the present embodiment, the first section is solid piece and the overlaid sliding telescopic action allows for adjustment from approximately 17 inches to 26 inches, while preserving the strength and integrity of the locking bar. The adjustable bar 16 is pivotally mounted at a first end 16a to a post of the rack assembly and is secured at a second end by a locking member to a second post, as described above with respect to FIGS. 1-2.

Figure 6:
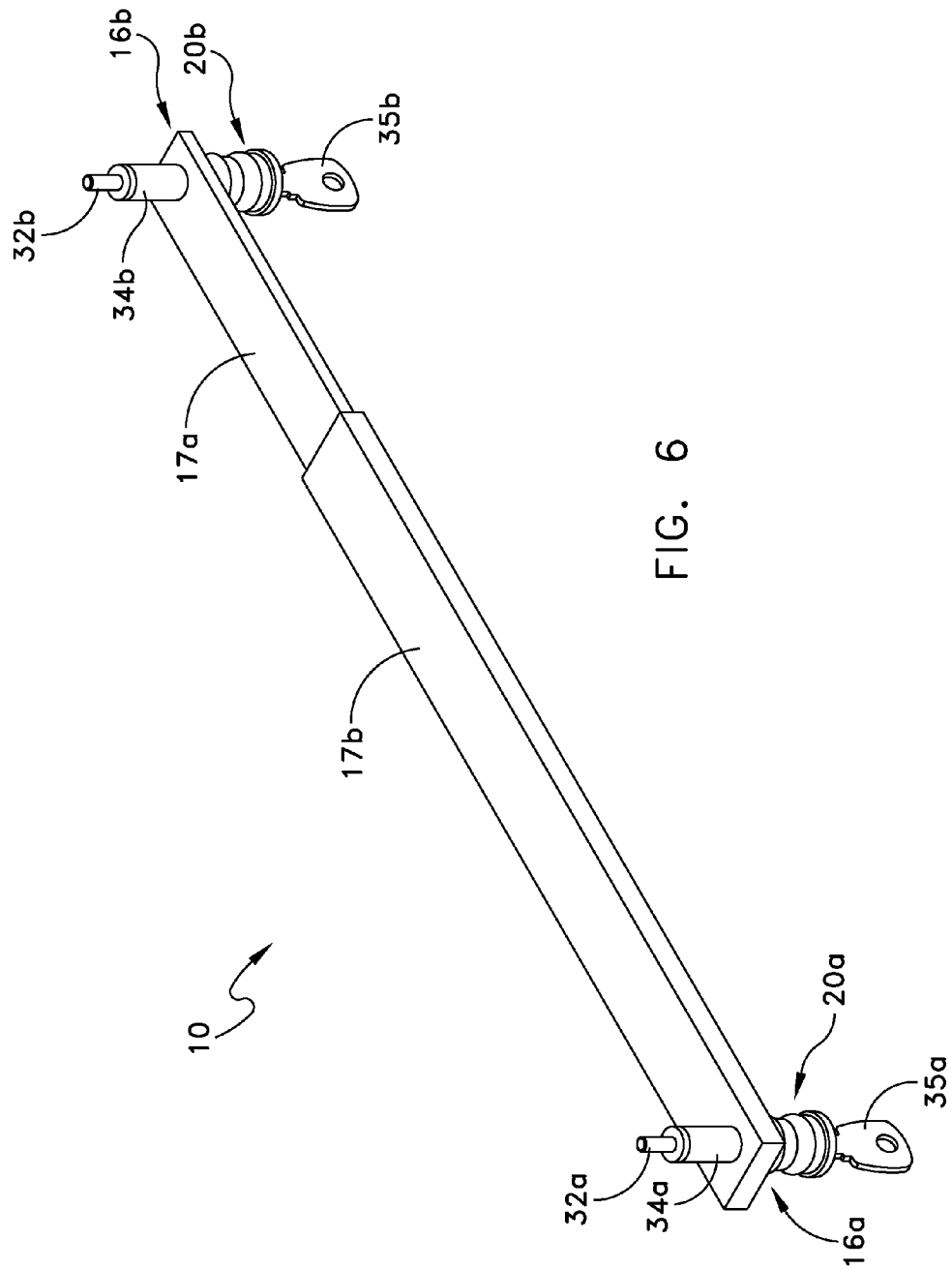
FIG. 6 is a perspective view of a third embodiment of an example extendable locking mechanism for use with a rack mounted electronic device according to the present disclosure.
Figure 7:
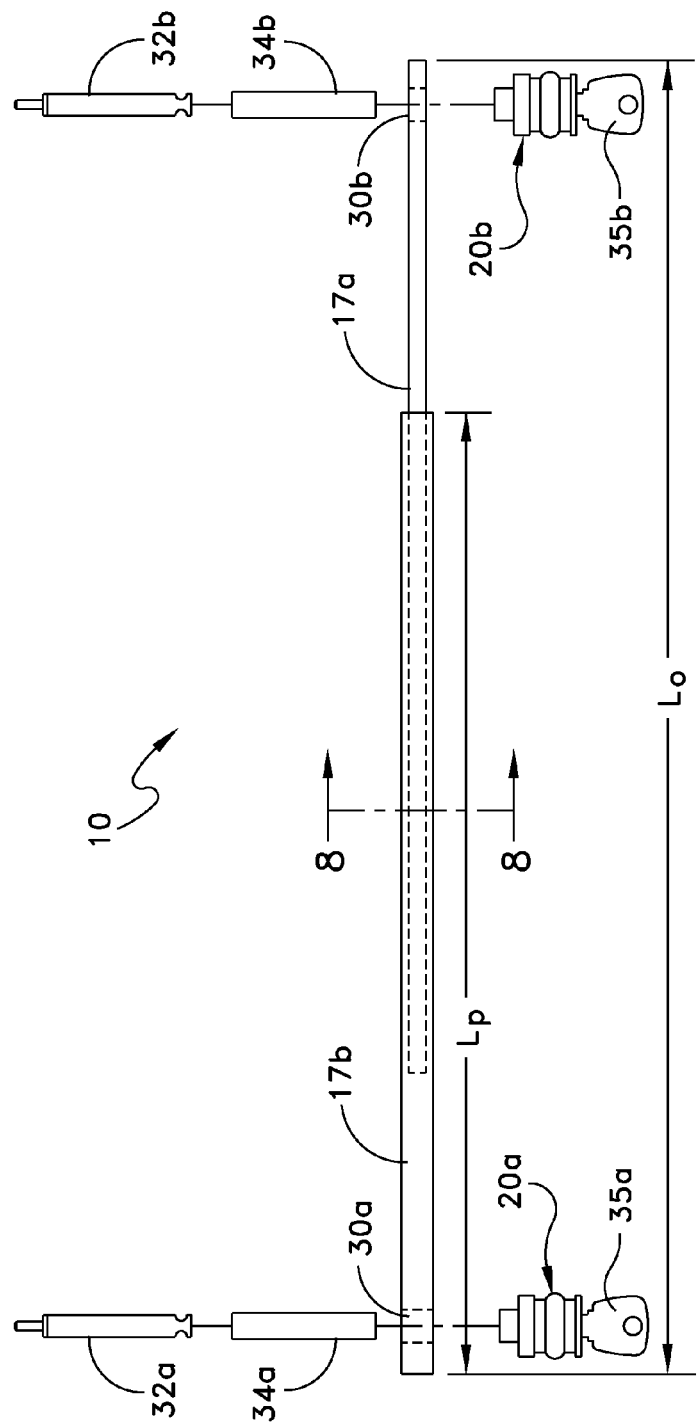
FIG. 7 is a side plan view of the example extendable locking mechanism of FIG. 6 with locking member and fastener in an exploded view.
Figure 8:
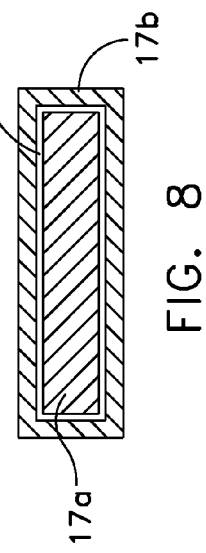
FIG. 8 is a cross-sectional view taken along lines 8-8 of FIG. 7.

Referring now to FIGS. 6-8 a third embodiment of an example locking mechanism 10 for use with a rack assembly 12 to minimize unauthorized access to electronic devices 14 mounted within the rack is illustrated. In this embodiment, the bar 16 is also adjustable in order to fit racks of varying widths, or to mount the bar diagonally between posts of the rack instead of horizontally. The adjustable bar 16 includes a first, telescoping section 17a and a second section 17b. The second section includes an interior cavity 19 disposed within at least a portion of the length $L_P$ of the first section that is sized to receive the second section of the bar therein. The first and section sections can slide relative to each other a predetermined amount so as to adjust the overall length of the bar, $L_O$, as described above with respect to FIGS. 3-6. In this embodiment, however, both the first and second ends 16a, 16b of the locking bar 16 are secured to first and second posts 12a, 12b of the rack assembly by a locking member 20a, 20b and mounting posts 32a, 32b. Thus, in this embodiment the mounting posts 32a, 32b are the only support devices and there is no pivotal arrangement to allow the bar 16 to swing outward when unlocked at one end. Instead, the present embodiment allows the user the flexibility of unlocking either end of the bar 16, at which point the bar can be rotated downward or upward in order to access the components of the electronic devices.

The locking mechanisms described herein minimize unauthorized removal of a rack mounted electronic device's components while not improperly interfering with ventilation, and allow for visual inspection of the components when in a locked position. The bar lock may also allow for limited access even in a locked position to the components without removing the component completely, for example when a component is damaged or failing. The locking mechanism may be utilized with any of a variety of electronic components, can readily be installed, and is intended to be unlocked only by authorized personnel.

While various embodiments of the invention have been particularly shown and described, it will be understood by those skilled in the art that various changes in form and details may be made therein without departing from the spirit and scope of the invention as defined by the appended claims. For example, the materials disclosed herein may be readily changed, as may the dimensions and geometric configurations.

What is claimed is:

1. A lockable rack assembly for storing electronic devices, the assembly comprising:
   a rack having at least a pair of adjacent, substantially parallel spaced support posts, each of the posts including one or more holes disposed there through, the posts being spaced so as to receive and support one or more electronic devices there between;
   a locking bar having a first end, a second end and a length defined there between, the length of the locking bar being sized to span the space between the pair of adjacent, parallel spaced support posts;
   a support device constructed and arranged to secure the first end of the locking bar to one of the support posts;
   a locking member movable between a locked and unlocked position, the locking member constructed and arranged to detachably secure the second end of the locking bar to the other of the support posts such that the bar is movable between a first, open position and a second, closed position;
   wherein in the first, open position the locking bar is secured at its first end to one of the support posts by the support device and is unsecured at its second end by the locking member being disengaged from the other of the support posts, such that a user can access an electronic device supported within the rack in order to remove components of the electronic device in the open position, and wherein in the second, closed position, the locking bar is secured at its first end to one of the support posts by the support device and is locked at its second end to the other of the support posts by the locking member which is in a locked position, at least a portion of the electronic device being obstructed by the bar, and access to components of the electronic device being restricted to users who have access to unlock the locking member;

wherein the support device has a mounting plate including an opening there through for receiving a fastener, and the mounting plate including a first mounting plate portion and a second mounting plate portion, the second mounting plate portion disposed substantially 90 degrees from the first mounting plate portion, and in the second, closed position the locking bar disposed substantially 90 degrees from the second mounting plate portion and substantially parallel to the first mounting plate portion, the support device being constructed and arranged to attach to a rear side of the one of the support posts; and wherein the mounting plate is configured to support the locking bar at a predetermined distance from the one of the support posts so as to provide a clearance between the locking bar and the electronic devices when the locking bar is disposed in the second, closed position in order to allow translation of at least one electronic component of the electronic components along a direction substantially perpendicular to the locking bar and within the distance defined between the at least one electronic component and the locking bar when the locking bar is disposed in the second, closed position.

2. The rack assembly of claim 1, further comprising a mounting rod constructed and arranged to engage the locking member, wherein the locking bar includes an opening disposed in the second end of the bar, the opening being sized to correspond to the holes in the support posts and to receive the mounting rod there through.

3. The rack assembly of claim 1, wherein the locking bar is pivotally supported on the mounting plate by a hinge such that the locking bar can swing outwardly away from the other of the posts into the open position when the locking member is unlocked.

4. The rack assembly of claim 3, wherein the hinge includes a sealed press-pin so as to prevent unauthorized removal of the locking bar from hinge.

5. The rack assembly of claim 1, wherein the bar includes a first section having a first length and a second section having a second length, an interior cavity disposed within at least a portion of the length of the second section and sized to receive the first section of the bar therein, such that the first and section sections are slideable relative to each other a predetermined amount so as to adjust the length of the bar.

6. The rack assembly of claim 1, wherein the bar has a rectangular shape.

7. The rack assembly of claim 1, wherein the bar has a cylindrical shape.

8. The rack assembly of claim 1, wherein in the closed position, the locking bar is supported substantially horizontally between the pair of adjacent, substantially parallel posts.

9. A locking mechanism for limiting access to a rack mounted electronic device, the locking mechanism comprising:

a locking bar having a first end, a second end and a length defined there between, the length of the locking bar being sized to span a space between a pair of adjacent, substantially parallel spaced support posts;

a support device constructed and arranged to support the first end of the locking bar to one of the support posts;

a locking member movable between a locked and unlocked position, the locking member constructed and arranged to detachably secure the second end of the locking bar to the other of the support posts, the bar being movable between a first, open position and a second, closed position;

wherein in the first, open position the locking bar is secured at its first end to one of the support posts by the support device and is unsecured at its second end by the locking member being disengaged from the other of the support posts, such that a user can access an electronic device supported within the rack in order to remove components of the electronic device in the open position, and wherein in the second, closed position, the locking bar is secured at its first end to one of the support posts by the support device and is locked at its second end to the other of the support posts by the locking member which is in a locked position, at least a portion of the electronic device being obstructed by the bar and access to components of the electronic device being restricted to users who have access to unlock the locking member;

wherein the support device has a mounting plate including an opening there through for receiving a fastener, and the mounting plate including a first mounting plate portion and a second mounting plate portion, the second mounting plate portion disposed substantially 90 degrees from the first mounting plate portion, and in the second, closed position the locking bar disposed substantially 90 degrees from the second mounting plate portion and substantially parallel to the first mounting plate portion, the support device being constructed and arranged to attach to a rear side of the one of the support posts; and wherein the mounting plate is configured to support the locking bar at a predetermined distance from the one of the support posts so as to provide a clearance between the locking bar and the electronic devices when the locking bar is disposed in the second, closed position in order to allow translation of at least one electronic component of the electronic components along a direction substantially perpendicular to the locking bar and within the distance defined between the at least one electronic component and the locking bar when the locking bar is disposed in the second, closed position.

10. The locking mechanism of claim 9, further comprising a mounting rod constructed and arranged to engage the locking member, wherein the locking bar includes an opening disposed in the second end of the bar, the opening being sized to correspond to the holes in the support posts and to receive the mounting rod there through.

11. The locking mechanism of claim 9, wherein the locking bar is pivotally supported on the mounting plate by a hinge such that the locking bar can swing outwardly away from the other of the posts into the open position when the locking member is unlocked.

12. The locking mechanism of claim 11, wherein the hinge includes a sealed press-pin so as to prevent unauthorized removal of the locking bar from hinge.

13. The locking mechanism of claim 9, wherein the bar includes a first section having a first length and a second section having a second length, an interior cavity disposed within at least a portion of the length of the second section and sized to receive the first section of the bar therein, such that the first and section sections are slideable relative to each other a predetermined amount so as to adjust the length of the bar.

14. The locking mechanism of claim 9, wherein in the closed position, the locking bar is supported substantially horizontally between the pair of adjacent, substantially parallel posts.

15. The rack assembly of claim 1:
   wherein a first post of the at least a pair of adjacent, substantially parallel spaced support posts defines a front side and the rear side, the front side of the first post facing outward from the rack assembly in a plane of the at least a pair of adjacent, substantially parallel spaced support posts, the rear side of the first post opposing the front side of the first post;
   wherein the rack assembly further comprises a fastener constructed and arranged to secure the support device to the rack; and
   wherein the support device attaches to the rear side of the first post, and the fastener secures the support device to the first post through one of the holes of the first post.

16. The rack assembly of claim 15:
   wherein the fastener includes a head and a lock washer;
   wherein the head of the fastener secures to the front side of the first post;
   wherein the lock washer secures to the support device on the rear side of the first post; and
   wherein in the second, closed position, the locking bar covers the head of the fastener.

17. The locking mechanism of claim 9:
   further comprising a fastener constructed and arranged to secure the support device to the rack;
   the fastener securing the first mounting plate portion to the one of the support posts through one of the holes of the one of the support posts.

18. The locking mechanism of claim 17:
   wherein the fastener includes a head and a lock washer;
   wherein the head of the fastener secures to a front side of the one of the support posts;
   wherein the lock washer secures to the support device on a rear side of the one of the support posts; and
   wherein in the second, closed position, the locking bar covers the head of the fastener.

19. A lockable rack assembly for storing electronic devices, the assembly comprising:
   a rack having at least a pair of adjacent, substantially parallel spaced support posts, each of the posts including one or more holes disposed there through, the posts being spaced so as to receive and support one or more electronic devices there between;
   a locking bar having a first end, a second end and a length defined there between, the length of the locking bar being sized to span the space between the pair of adjacent, parallel spaced posts;
   a support device constructed and arranged to secure the first end of the locking bar to one of the support posts;
   a locking member movable between a locked and unlocked position, the locking member constructed and arranged to detachably secure the second end of the locking bar to the other of the support posts such that the bar is movable between a first, open position and a second, closed position;
   wherein in the first, open position the locking bar is secured at its first end to one of the support posts by the support device and is unsecured at its second end by the locking member being disengaged from the other of the support posts, such that a user can access an electronic device supported within the rack in order to remove components of the electronic device in the open position, and wherein in a second, closed position, the locking bar is secured at its first end to one of the support posts by the support device and is locked at its second end to the other of the support posts by the locking member which is in a locked position, at least a portion of the electronic device being obstructed by the bar, and access to components of the electronic device being restricted to users who have access to unlock the locking member;
   wherein the support device has a mounting plate including an opening there through for receiving a fastener, the fastener also being sized to be received through the one or more holes in the post during use;
   wherein the locking bar is supported a predetermined distance from the post so as to provide a clearance between the bar and the electronic devices in order to allow partial removal of the electronic components while the locking bar is in the closed position;
   wherein a first post of the at least a pair of adjacent, substantially parallel spaced support posts defines a front side and a rear side, the front side of the first post facing outward from the rack assembly in a plane of the at least a pair of adjacent, substantially parallel spaced support posts, the rear side of the first post opposing the front side of the first post;
   wherein the rack assembly further comprises a fastener constructed and arranged to secure the support device to the rack; and
   wherein the support device attaches to the rear side of the first post, and the fastener secures the support device to the first post through one of the holes of the first post.

* * * * *

UNITED STATES PATENT AND TRADEMARK OFFICE
CERTIFICATE OF CORRECTION

| | |
|---|---|
| PATENT NO. | : 7,850,013 B1 |
| APPLICATION NO. | : 11/821007 |
| DATED | : December 14, 2010 |
| INVENTOR(S) | : David B. Kramer et al. |

It is certified that error appears in the above-identified patent and that said Letters Patent is hereby corrected as shown below:

Claim 5, Column 7, Lines 45-51 "The rack assembly of claim 1, wherein the bar includes a first section having a first length and a second section having a second length, an interior cavity disposed within at least a portion of the length of the second section and sized to receive the first section of the bar therein, such that the first and section sections are slideable relative to each other a predetermined amount so as to adjust the length of the bar." should read -- The rack assembly of claim 1, wherein the bar includes a first section having a first length and a second section having a second length, an interior cavity disposed within at least a portion of the length of the second section and sized to receive the first section of the bar therein, such that the first and second sections are slideable relative to each other a predetermined amount so as to adjust the length of the bar. --

Claim 13, Column 8, Lines 61-67, "The locking mechanism of claim 13, wherein the bar includes a first section having a first length and a second section having a second length, an interior cavity disposed within at least a portion of the length of the second section and sized to receive the first section of the bar therein, such that the first and section sections are slideable relative to each other a predetermined amount so as to adjust the length of the bar." should read -- The locking mechanism of claim 13, wherein the bar includes a first section having a first length and a second section having a second length, an interior cavity disposed within at least a portion of the length of the second section and sized to receive the first section of the bar therein, such that the first and second sections are slideable relative to each other a predetermined amount so as to adjust the length of the bar. --

Signed and Sealed this
First Day of February, 2011

David J. Kappos
*Director of the United States Patent and Trademark Office*